(12) United States Patent
Truhitte et al.

(10) Patent No.: US 10,770,333 B2
(45) Date of Patent: Sep. 8, 2020

(54) WAFER LEVEL FLAT NO-LEAD SEMICONDUCTOR PACKAGES AND METHODS OF MANUFACTURE

(71) Applicant: SEMICONDUCTOR COMPONENTS INDUSTRIES, LLC, Phoenix, AZ (US)

(72) Inventors: Darrell D. Truhitte, Phoenix, AZ (US); James P. Letterman, Jr., Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/293,168

(22) Filed: Mar. 5, 2019

(65) Prior Publication Data

US 2019/0198375 A1    Jun. 27, 2019

Related U.S. Application Data

(62) Division of application No. 15/883,625, filed on Jan. 30, 2018, now Pat. No. 10,269,609, which is a
(Continued)

(51) Int. Cl.
*H01L 21/78* (2006.01)
*H01L 21/683* (2006.01)
(Continued)

(52) U.S. Cl.
CPC ...... *H01L 21/6835* (2013.01); *H01L 21/4832* (2013.01); *H01L 21/561* (2013.01);
(Continued)

(58) Field of Classification Search
CPC ................. H01L 21/78; H01L 24/83
See application file for complete search history.

(56) References Cited

U.S. PATENT DOCUMENTS 6,291,271 B1   9/2001 Lee et al.
7,682,935 B2   3/2010 Burke et al.
(Continued)

OTHER PUBLICATIONS

"New FO-WLP RDL-First Manufacturing Process Delivers Products Ultra-Compact Packages Incorporating Highly Reliabl, High-Density Interconnects," (Dec. 2010) by Renesas, www.renesas.com, last accessed Jul. 15, 2014.
(Continued)

*Primary Examiner* — Thomas L Dickey
(74) *Attorney, Agent, or Firm* — Adam R. Stephenson, LTD.

(57) ABSTRACT

Methods of manufacturing semiconductor packages. Implementations may include: providing a substrate with a first side, a second side, and a thickness; forming a plurality of pads on the first side of the substrate; and applying die attach material to the plurality of pads. The method may include bonding a wafer including a plurality of semiconductor die to the substrate at one or more die pads included in each die. The method may also include singulating the plurality of semiconductor die, overmolding the plurality of semiconductor die and the first side of the substrate with an overmold material, and removing the substrate to expose the plurality of pads and to form a plurality of semiconductor packages coupled together through the overmold material. The method also may include singulating the plurality of semiconductor packages to separate them.

20 Claims, 16 Drawing Sheets

Related U.S. Application Data division of application No. 14/341,454, filed on Jul. 25, 2014, now Pat. No. 9,892,952.

(51) Int. Cl.
| | | |
|---|---|---|
| *H01L 23/31* | (2006.01) | |
| *H01L 21/56* | (2006.01) | |
| *H01L 21/48* | (2006.01) | |
| *H01L 23/00* | (2006.01) | |
| H01L 23/36 | (2006.01) | |
| H01L 23/495 | (2006.01) | |
| H01L 25/065 | (2006.01) | |
| H01L 25/10 | (2006.01) | |

(52) U.S. Cl.
CPC ...... *H01L 21/6836* (2013.01); *H01L 23/3107* (2013.01); *H01L 24/11* (2013.01); *H01L 24/27* (2013.01); *H01L 24/49* (2013.01); *H01L 24/92* (2013.01); *H01L 24/94* (2013.01); *H01L 24/95* (2013.01); *H01L 24/96* (2013.01); *H01L 24/97* (2013.01); H01L 21/568 (2013.01); H01L 21/78 (2013.01); H01L 23/3114 (2013.01); H01L 23/36 (2013.01); H01L 23/49537 (2013.01); H01L 24/13 (2013.01); H01L 24/16 (2013.01); H01L 24/29 (2013.01); H01L 24/32 (2013.01); H01L 24/33 (2013.01); H01L 24/48 (2013.01); H01L 24/75 (2013.01); H01L 24/81 (2013.01); H01L 24/83 (2013.01); H01L 24/85 (2013.01); H01L 25/0657 (2013.01); H01L 25/105 (2013.01); H01L 2221/68304 (2013.01); H01L 2221/68327 (2013.01); H01L 2221/68377 (2013.01); H01L 2221/68381 (2013.01); H01L 2224/04105 (2013.01); H01L 2224/11 (2013.01); H01L 2224/11003 (2013.01); H01L 2224/116 (2013.01); H01L 2224/119 (2013.01); H01L 2224/1132 (2013.01); H01L 2224/1146 (2013.01); H01L 2224/11312 (2013.01); H01L 2224/11334 (2013.01); H01L 2224/11418 (2013.01); H01L 2224/11462 (2013.01); H01L 2224/131 (2013.01); H01L 2224/1308 (2013.01); H01L 2224/1319 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/13164 (2013.01); H01L 2224/13166 (2013.01); H01L 2224/16245 (2013.01); H01L 2224/16258 (2013.01); H01L 2224/27003 (2013.01); H01L 2224/276 (2013.01); H01L 2224/279 (2013.01); H01L 2224/2732 (2013.01); H01L 2224/2746 (2013.01); H01L 2224/27312 (2013.01); H01L 2224/27334 (2013.01); H01L 2224/27418 (2013.01); H01L 2224/27462 (2013.01); H01L 2224/291 (2013.01); H01L 2224/2908 (2013.01); H01L 2224/2919 (2013.01); H01L 2224/29124 (2013.01); H01L 2224/29139 (2013.01); H01L 2224/29144 (2013.01); H01L 2224/29147 (2013.01); H01L 2224/29155 (2013.01); H01L 2224/29164 (2013.01); H01L 2224/29166 (2013.01); H01L 2224/32245 (2013.01); H01L 2224/32258 (2013.01); H01L 2224/33181 (2013.01); H01L 2224/45015 (2013.01); H01L 2224/4811 (2013.01); H01L 2224/48091 (2013.01); H01L 2224/48111 (2013.01); H01L 2224/48145 (2013.01); H01L 2224/48247 (2013.01); H01L 2224/48465 (2013.01); H01L 2224/49109 (2013.01); H01L 2224/73204 (2013.01); H01L 2224/73265 (2013.01); H01L 2224/753 (2013.01); H01L 2224/75251 (2013.01); H01L 2224/75252 (2013.01); H01L 2224/75755 (2013.01); H01L 2224/75756 (2013.01); H01L 2224/8121 (2013.01); H01L 2224/81192 (2013.01); H01L 2224/81805 (2013.01); H01L 2224/81815 (2013.01); H01L 2224/81856 (2013.01); H01L 2224/83 (2013.01); H01L 2224/83005 (2013.01); H01L 2224/8321 (2013.01); H01L 2224/83191 (2013.01); H01L 2224/83192 (2013.01); H01L 2224/83805 (2013.01); H01L 2224/83815 (2013.01); H01L 2224/83856 (2013.01); H01L 2224/85005 (2013.01); H01L 2224/92 (2013.01); H01L 2224/92125 (2013.01); H01L 2224/92147 (2013.01); H01L 2224/92227 (2013.01); H01L 2224/94 (2013.01); H01L 2224/95 (2013.01); H01L 2224/97 (2013.01); H01L 2924/00014 (2013.01); H01L 2924/181 (2013.01); H01L 2924/3511 (2013.01)

(56) References Cited

U.S. PATENT DOCUMENTS

| | | | |
|---|---|---|---|
| 2002/0114133 A1* | 8/2002 | Ho | H01L 23/36 361/704 |
| 2003/0109077 A1 | 6/2003 | Kim et al. | |
| 2004/0259288 A1 | 12/2004 | Mostafazadeh et al. | |
| 2005/0140007 A1 | 6/2005 | Jobetto | |
| 2006/0084202 A1 | 4/2006 | Liu et al. | |
| 2006/0208363 A1 | 9/2006 | Shiu et al. | |
| 2008/0157303 A1* | 7/2008 | Yang | H01L 21/568 257/676 |
| 2010/0224970 A1 | 9/2010 | Powell et al. | |
| 2010/0237491 A1 | 9/2010 | Park et al. | |
| 2013/0062761 A1 | 3/2013 | Lin et al. | |
| 2013/0095615 A1 | 4/2013 | Sun et al. | |
| 2014/0110835 A1 | 4/2014 | Ong et al. | |
| 2014/0131898 A1 | 5/2014 | Shearer et al. | |
| 2015/0048390 A1 | 2/2015 | Imazu et al. | |
| 2015/0171034 A1 | 6/2015 | Yu et al. | |
| 2015/0171132 A1 | 6/2015 | Chen et al. | |

OTHER PUBLICATIONS

"Renesas Electronics Develops Package Technology that Realizes Miniaturization at the Bare Chip Level," news release Oct. 19, 2010, by Renesas, www.renesas.com/press/news/2010/news20101019.jsp, last accessed Jul. 15, 2014.

"New FO-WLP RDL-First Manufacturing Process Delivers Products Ultra-Compact Packages Incorporating Highly Reliable, High-Density Interconnects," (2010-2014) by Renesas Electronics Corporation, www.am.renesas.com/edge_ol/r_and_d/01/index.jsp, last accessed Jul. 15, 2014.

"3D Integration: Why, What, Who, When?", Future Fab International (Issue Jul. 23, 2007), authors James Jian-Qiang Lu, Ken Rose and Susan Vitkavage.

* cited by examiner

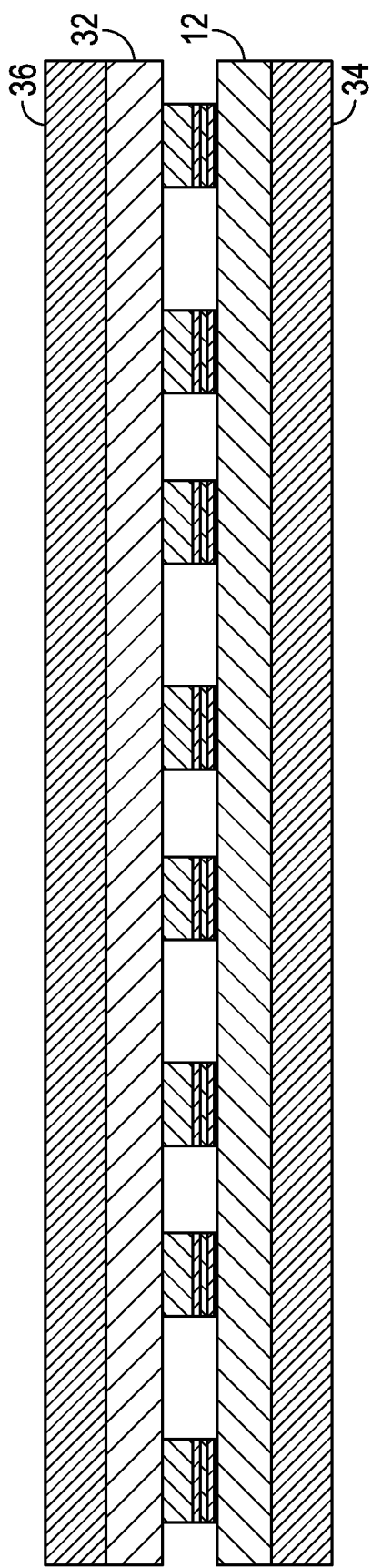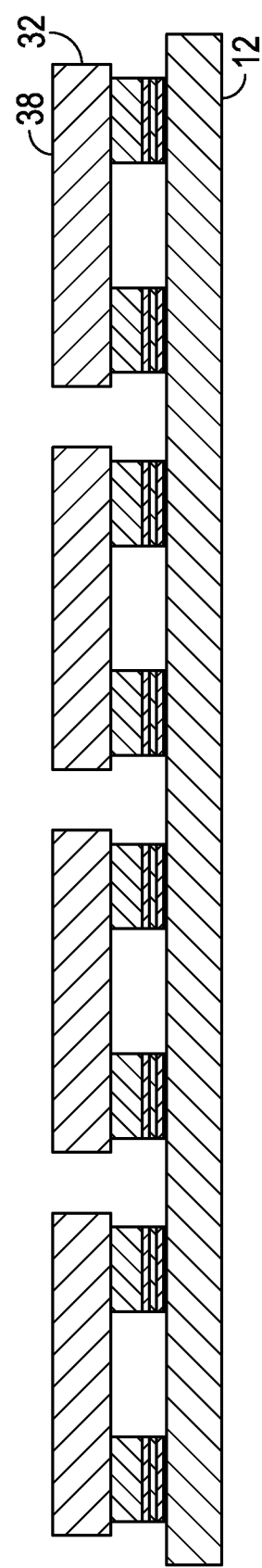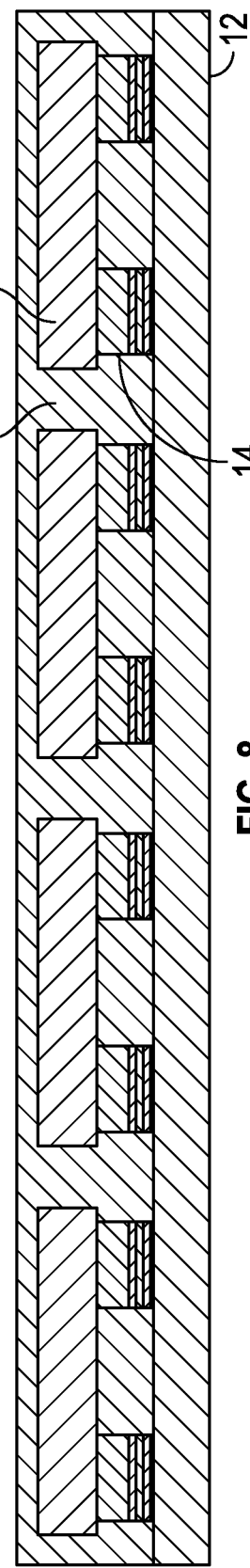

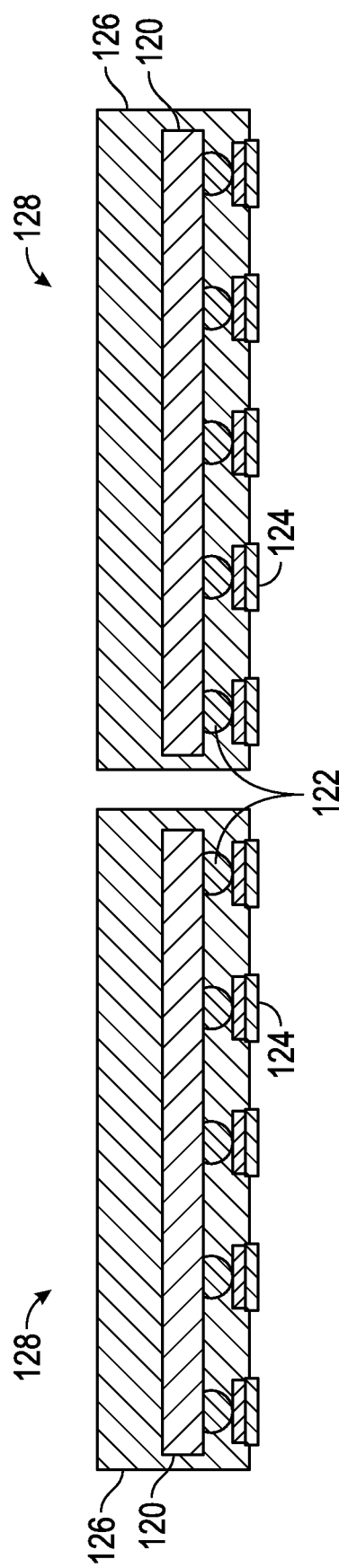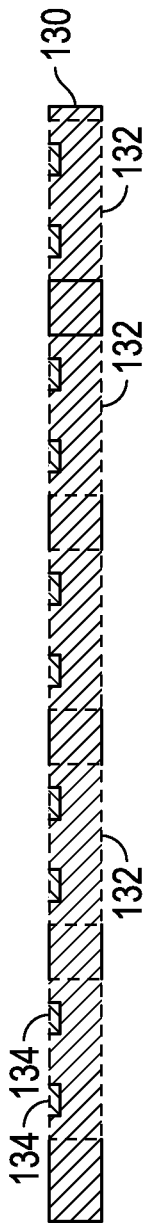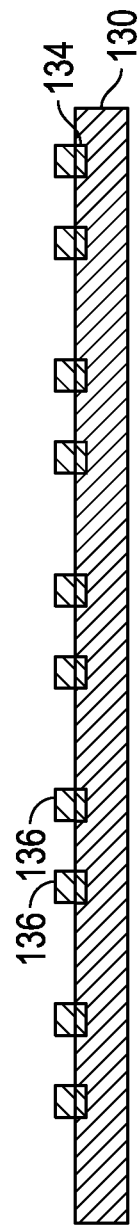
FIG. 30
FIG. 31
FIG. 32

WAFER LEVEL FLAT NO-LEAD SEMICONDUCTOR PACKAGES AND METHODS OF MANUFACTURE

CROSS REFERENCE TO RELATED APPLICATIONS

This application is a divisional application of earlier U.S. Utility patent application to Truhitte entitled "Wafer Level Flat No-Lead Semiconductor Packages and Methods of Manufacture," application Ser. No. 15/883,625, filed Jan. 30, 2018, now pending, which application is a divisional application of the earlier U.S. Utility patent application to Truhitte entitled "Wafer Level Flat No-Lead Semiconductor Packages and Methods of Manufacture," application Ser. No. 14/341,454, filed Jul. 25, 2014, now issued as U.S. Pat. No. 9,892,952, the disclosures of each of which are hereby incorporated entirely herein by reference.

BACKGROUND

1. Technical Field

Aspects of this document relate generally to packages used for semiconductor devices, such as systems and methods used to connect a semiconductor die to associated circuitry.

2. Background Art

Conventional semiconductor packages connect a semiconductor die to a motherboard or other associated circuitry and provide thermal and environmental protection for the device. Examples of conventional semiconductor packages include quad-flat no-lead (QFN), dual-flat no-lead (DFN) and leadless land grid array (LLGA) packages. Conventional packages are constructed one at a time and involve die bonding, wire bonding, overmolding, and other processing steps used to create a mechanical structure that protects the die from environmental, thermal, electrostatic discharge, and other hazards during operation.

SUMMARY

Implementations of a first method of manufacturing a semiconductor package may include: providing a substrate where the substrate has a first side, a second side, and a thickness between the first side and the second side; forming a plurality of pads on the first side of the substrate; and applying die attach material to the plurality of pads. The method may also include bonding a wafer including a plurality of semiconductor die to the substrate at one or more die pads included in each die of the plurality of semiconductor die through the plurality of pads of the substrate. The method may also include singulating the plurality of semiconductor die, overmolding the plurality of semiconductor die and the first side of the substrate with an overmold material, and removing the substrate to expose the plurality of pads and to form a plurality of semiconductor packages coupled together through the overmold material. The method also may include singulating the plurality of semiconductor packages to separate each of the plurality of semiconductor packages from each other.

Implementations of the first method of manufacturing a semiconductor package may include one, all, or any of the following:

Removing the substrate to expose the plurality of pads may further include removing the second side and the thickness of the substrate.

Providing the substrate may further include providing the substrate with the first side dimensioned to cover one quarter, one half, three quarters, or an entire size of the wafer.

Forming the plurality of pads on the first side of the substrate may further include selectively etching the first side of the substrate to form to form the plurality of pads or plating the plurality of pads on the substrate.

Bonding the wafer including the plurality of semiconductor die to the substrate may further include bonding through reflowing the plurality of pads and the one or more die pads of the plurality of die using a reflow process. It may also include curing the die attach material between the plurality of pads and the one or more die pads using a curing process.

Removing the substrate to expose the plurality of pads may further include selectively removing the substrate to leave one or more portions of the substrate for use in aligning the plurality of semiconductor packages during singulation and/or electrically connecting one or more of the semiconductor packages to one or more other semiconductor packages.

Applying die attach material to the one or more pads may further include applying the die attach material to a predetermined number of the plurality of pads and not applying the die attach material to the remaining pads.

After singulating the plurality of semiconductor die, attaching to one or more of the die (first die) a second die and electrically coupling the second die to the substrate.

Electrically coupling the second die to the substrate may further include wire bonding one or more die pads included in the second die to one more pads of the plurality of pads.

Electrically connecting the second die to the substrate may further include wire bonding one or more die pads included in the second die to the one or more die pads of the first die.

Bonding the wafer including the plurality of semiconductor die to the substrate at one or more die pads included in each die may further include where the one or more die pads include a bump and the plurality of pads of the substrate are bonded to the bump using a reflow process and/or a curing process.

Implementations of a second method of manufacturing a semiconductor package may include providing a substrate having a first side, a second side, a thickness. The substrate may include a pattern. The method may also include bonding a wafer including a plurality of semiconductor die to the first side of the substrate at one more die pads included in each one of the plurality of semiconductor die and overmolding and/or underfilling the first side of the substrate with and overmolding and/or underfill material, respectively. The method may also include selectively removing the thickness of the substrate from the second side of the substrate and singulating the plurality of die and the overmold material and/or the underfill material to form a plurality of semiconductor packages.

Implementations of a second method of manufacturing a semiconductor package may include, one, all, or any of the following:

Providing the substrate may further include where the pattern included in the first side of the substrate is formed by selectively etching the pattern into the first side of the substrate, stamping the pattern into the first side of the substrate, selectively plating the pattern onto the first side of the substrate, and any combination of the foregoing.

The method may further include stacking two or more of the plurality of semiconductor packages and electrically coupling and/or mechanically coupling the two or more stacked semiconductor packages thereby.

The method may further include coupling a heat dissipation device to each of the plurality of semiconductor packages where the heat dissipation device is placed in contact with the semiconductor die.

Singulating the plurality of die and the overmold material and/or the underfill material to form the plurality of semiconductor packages may further include selectively singulating to leave two or more of the plurality of semiconductor packages coupled together where the coupling of the two or more semiconductor packages is electrical and/or mechanical.

Implementations of a third method of manufacturing a semiconductor package may include providing a first base frame, applying die attach material on (to) the first base frame, and bonding a wafer including a plurality of semiconductor die to the first base frame at one or more die pads included in each one of the plurality of semiconductor die through the die attach material. The method may also include singulating the plurality of semiconductor die, applying die attach material to the plurality of die and/or a second base frame, and bonding the second base frame to the plurality of die through the die attach material. The method may include overmolding and/or underfilling the plurality of semiconductor die between the first base frame and the second base frame and singulating the first and second base frames to form a plurality of semiconductor packages.

Implementations of a fourth method of manufacturing a semiconductor package may include providing a wafer having a plurality of semiconductor die, each having one or more die pads and forming a plurality of package pads where each package pad is coupled to each of the one or more die pads. The method may also include mounting the wafer to a wafer singulation tape coupled to a wafer singulation tape coupled to a frame, singulating the plurality of semiconductor die, and overmolding or underfilling the plurality of semiconductor die coupled to the wafer singulation tape to form a plurality of semiconductor packages. The method may also include transferring the plurality of semiconductor packages to a package singulation tape coupled to a frame and singulating the plurality of semiconductor packages coupled to the package singulation tape to separate each of the plurality of semiconductor packages from each other.

Implementations of the method of manufacturing a semiconductor package may include one, all, or any of the following:

Mounting the wafer to the wafer singulation tape coupled to a frame further includes where the wafer singulation tape is dual flat no-lead mold tape.

Mounting the wafer to a wafer singulation tape coupled to the frame may further include where the wafer singulation tape is tape grid ball array (TBGA) flex tape having a plurality of package pad vias therethrough. The method may further include inserting the plurality of package pads into the plurality of package pad vias and where singulating the plurality of semiconductor packages further includes singulating the TBGA flex tape during singulation the plurality of semiconductor packages.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 6 is a cross sectional view of an implementation of a substrate and wafer showing the structure of various implementations of bonding apparatus;

FIG. 7 is a cross sectional view of an implementation of a substrate showing the die following singulation;

FIG. 8 is a cross sectional view of an implementation of a substrate following overmolding;

FIG. 30 is a cross sectional view of two semiconductor packages following overmolding and singulation showing die that include bumps bonded to the pads of a substrate implementation;

FIG. 31 is a cross sectional view of a wafer showing a plurality of die with die pads;

FIG. 32 is a cross sectional view of the wafer of FIG. 31 with package pads coupled to the die pads;

DESCRIPTION

This disclosure, its aspects and implementations, are not limited to the specific components, assembly procedures or method elements disclosed herein. Many additional components, assembly procedures and/or method elements known in the art consistent with the intended methods of manufacturing semiconductor packages and semiconductor packages themselves will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such methods, semiconductor packages, and implementing components and methods, consistent with the intended operation and methods.

Figure 1:
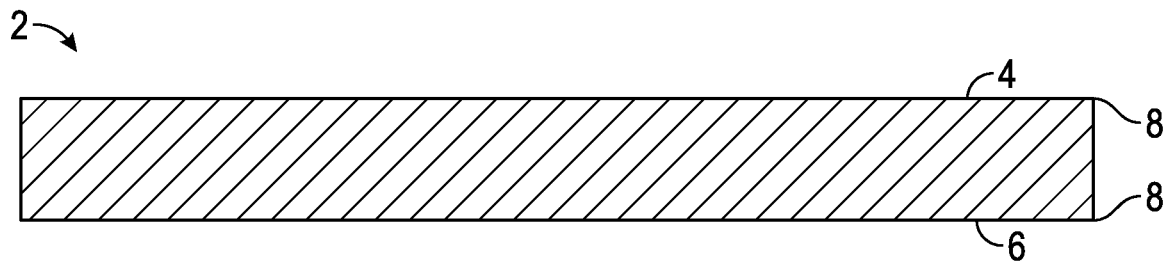
FIG. 1 is a cross sectional view of a substrate.
Figure 12A:
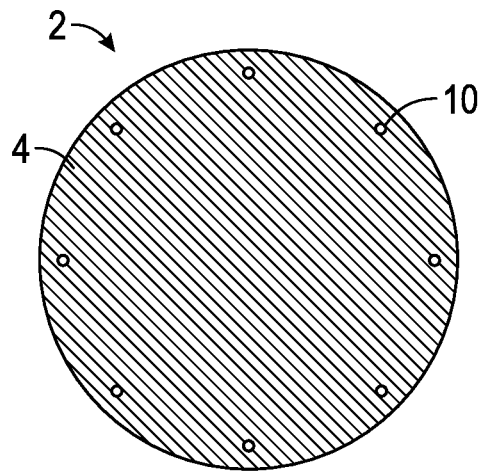
FIG. 12A is a top view of a first side of an implementation of a substrate.

Implementations of a first method of manufacturing a semiconductor package utilize a substrate. Referring to FIGS. 1 and 12A, an implementation of a substrate 2 is illustrated. The substrate has a first side 4, a second side 6, and a thickness 8 between the first side 4 and the second side 6. As illustrated, the first and second sides 4, 6 of the substrate 2 are sized larger than the largest flat surface of a semiconductor wafer. In such an implementation, the substrate 2 contains alignment holes 10 therethrough which are located to assist with aligning the wafer with the substrate 2. This alignment can take place through referencing the flat or notch of the wafer and the alignment holes 10. As illustrated, these alignment holes 10 may be located right at the edge of the location where the wafer edge contacts the substrate 2. In other implementations, the alignment holes 10 may be located in areas within the circumference of the wafer itself. The substrate 2 can include one or more identification codes (such as a bar code) which may be utilized by processing equipment to track the substrate 2 during the manufacturing process and to associate wafer map(s) containing die sort information for the particular wafer with the substrate for use in die sorting further in the process.

In various implementations of substrates 2, the substrate 2 may be smaller than the size of the largest flat surface of the wafer and may cover one quarter, one half, three quarters, the entire size of the largest flat surface of the wafer, or any portion of the wafer that contains at least two or more semiconductor die formed thereon. Accordingly, in various implementations, multiple substrates may be employed when packaging die contained in a single wafer. Because in many method implementations disclosed herein, the semiconductor die are processed in wafer level pieces, implementations of the methods disclosed herein may be referred to as "wafer level" packaging methods. In implementations of substrates that are the same size as the wafer, the substrate may include a notch/flat alignment feature configured to align with the wafer notch/flat. In various implementations, alignment patterns may be printed, stamped, etched, or otherwise formed in the surface of the substrate 2 for use during processing to align the wafer with the substrate. These alignment features may be utilized by other process tools, including singulation tools, such as saws, in subsequent processing steps. In addition, in particular implementations, patterns may be formed in the surface of the substrate using any method disclosed herein that are design to relieve stress caused by coefficient of thermal expansion (CTE) mismatch (differences) between the particular material the substrate is formed from and the material forming the wafer or semiconductor die on the wafer. In such implementations, the patterns may alleviate differences in the thermal expansion behaviors between the two materials of the substrate and wafer.

Substrate 2 implementations may include materials such as, by non-limiting example, metals and other metal alloys such as copper, Alloy 42 (42% Ni, balance Fe), plastics, composites, resins, and any other material that is capable of being etched or otherwise removed during subsequent processing without damaging the semiconductor die. The substrate may also be a silicon wafer or other wafer formed of a semiconducting material. In implementations where a silicon wafer used, the thickness of the wafer may be about 8 to about 15 mils. Those of ordinary skill will appreciate that a wide variety of materials may be employed in various implementations of substrates and will be able to select these materials according to the principles disclosed herein.

Figure 2A:
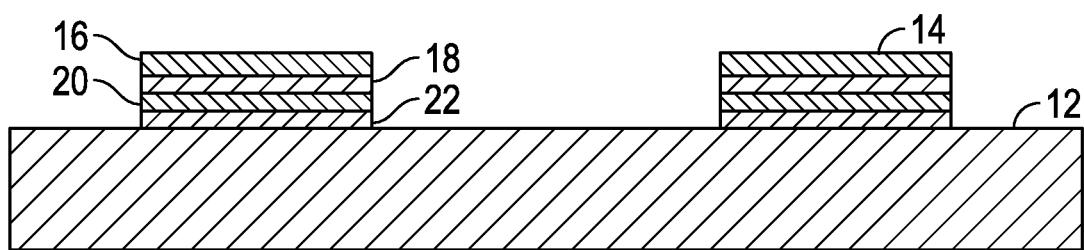
FIG. 2A is a cross sectional view of an implementation of a substrate with plated pads.
Figure 12B:
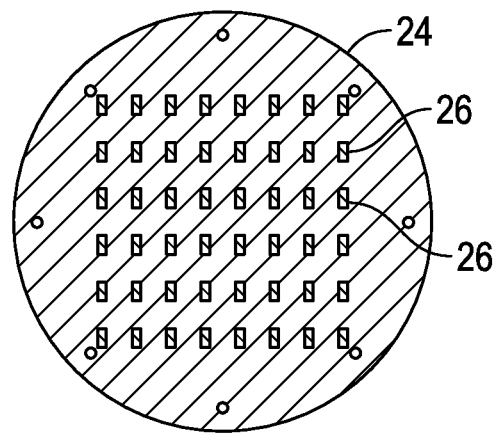
FIG. 12B is a top view of the first side showing a plurality of pads.
Figure 12C:
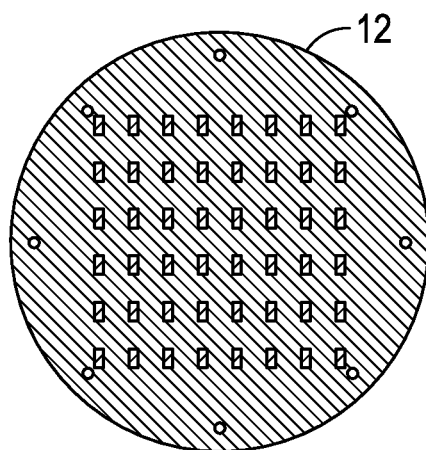
FIG. 12C is a top view of the first side with die attach material applied to the pads.

Referring to FIGS. 2A and 12C, an implementation of a substrate 12 with plated pads 14 is illustrated. As illustrated, the pads 14 may be formed of one or more layers of plated materials. In the implementation illustrated in FIGS. 2A and 12C, the pad 14 is formed by first sequentially selectively plating layers of gold, palladium, nickel, and palladium (22, 20, 18, 16, respectively) to form a PdNiPdAu stacked plated pad 14. Any of a wide variety of conventional plating techniques and systems may be utilized in forming the pads 14, such as, by non-limiting example, electroplating, solder patterning, epoxy patterning, thick film plating, patterned solder dispense, and any other metal plating/dispensing technique. The pads 14 are plated at a desired size to correspond with one or more die pads on the semiconductor die included on the semiconductor wafer. The particular size and pitch of the pads 14 plated on the substrate 12 is decided to establish the pads of the finished semiconductor package. The particular size and pitch of the pads 14 plated on the substrate 12 is decided to ensure proper coverage of the die pads and the flow characteristics of applied fillets of die attach materials to be used later on in the process, if the die attach materials are intended to be flowable. While in particular implementations, the pitch and size of the pads corresponds with the pitch and size of the die pads, this relationship is not required, but may vary according to the characteristics of the die pads or substrate (i.e., if the die pads include bumps). Furthermore, there may be fewer pads than the number of die pads or more, depending upon the nature of the electrical interconnect structure formed between the die and the substrate. The thickness of the plated pad (and pad stack if multilayered) is determined to ensure that encapsulating material (overmold or underfill) can enter the regions between the wafer and the substrate when the wafer and substrate 12 are bonded together in subsequent processing steps.

In various implementations, the wafer may be thinned through grinding and/or lapping prior to processing using the method implementations disclosed herein or may be processed without any thinning. In particular implementations, the thickness of the wafer may be about 4 to about 6 mils. In particular implementations, the size of the die pads may be about 75 microns. Each die pad may be surrounded by various layers of material intended to aid in passifying the active area of the die, including, by non-limiting example, oxide, nitride, polyimide, and other materials intended to prevent moisture and other physical and electrical contaminants from entering the active area of the die. The die pad may be formed of an aluminum copper metal alloy or other metal material adapted for use in epoxy, solder, or eutectic bonding as described herein. Where the size of the die pads is about 75 microns, the size of the pads 14 is about 170 by about 110 microns to match the finished case outline dimensions. The metal selected for the pads 14 may be Cu, Au, a TiNiAgAu alloy (stack in particular implementations, NiPdAu as disclosed herein, or other solderable metals and metal alloys that will not etch during subsequent processing steps (such as substrate removal or wafer grinding/thinning).

Figure 2B:
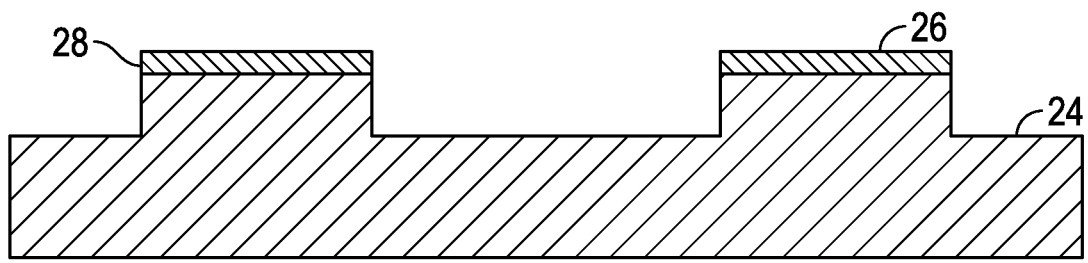
FIG. 2B is a cross sectional view of another implementation of a substrate with etched pads.

Referring to FIGS. 2B and 12B, an implementation of a substrate 24 is illustrated that has pads 26 that have been selectively etched into the substrate 24. As illustrated, the substrate 24 may have a patterning material 28 placed above each of the pads 26 to protect them from the etching process and form the pad. This patterning material 28 may be photoresist, hard mask, solder, epoxy, a plated dissimilar metal to the metal of the substrate, or any other material resistant to the particular etching process/chemistry employed. The patterning material 28 may be removed after the etching process or may remain on the pads 26 if a material appropriate for bonding or subsequent processing. In various implementations, an etching process may not be used to form the pads, but they may be formed by stamping or other mechanical processing (including casting, molding, etc. during formation of the substrate itself) of the substrate.

Figure 3:
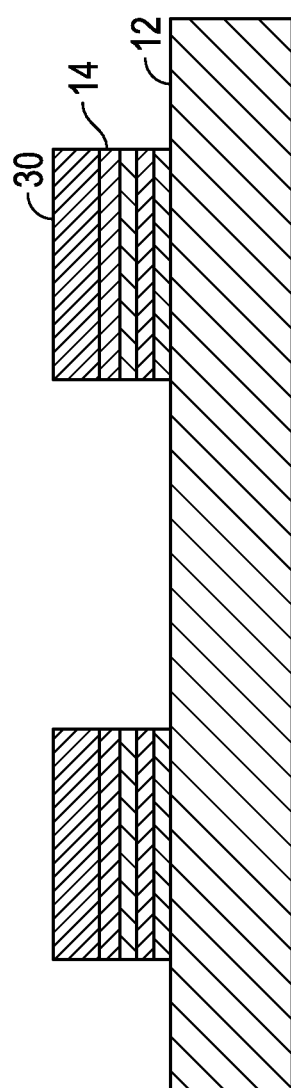
FIG. 3 is a cross sectional view of an implementation of a substrate with die attach material applied to the pads.

Referring to FIGS. 3 and 12C, the substrate 12 implementation illustrated in FIG. 2A is shown after application of die attach material 30 to the pads 14. The die attach material 30 may be any of a wide variety of materials including solder, epoxy, patterned die attach film (DAF), solder preforms, and any other material capable of participating in and/or establishing a bond between the pads 14 and the die pads on the wafer. The die attach material 30 may be applied to the pads through use of a stencil and screen printing, a stencil and spray coating, patterned solder dispense, patterned epoxy dispense, or application of DAF to the top surfaces of the pads 14. Many other conventional processing techniques may be utilized in applying the die attach material to the pads 14. Where epoxy is used, the epoxy may remain uncured until the next processing step or may be B-stage cured prior to subsequent processing. The die attach material may also, in particular implementations, be electrically conductive.

In this and other implementations of methods of forming a semiconductor package disclosed herein, the process of applying and using a die attach material 30 may not be used. In such implementations, instead of using a die attach material 30, a thermal process may be employed to form eutectic metal bonds between the metal(s) in the pads and the die pads. Accordingly, the step of applying die attach material 30 is omitted in these implementations after the pads are formed on the substrate.

Figure 4:
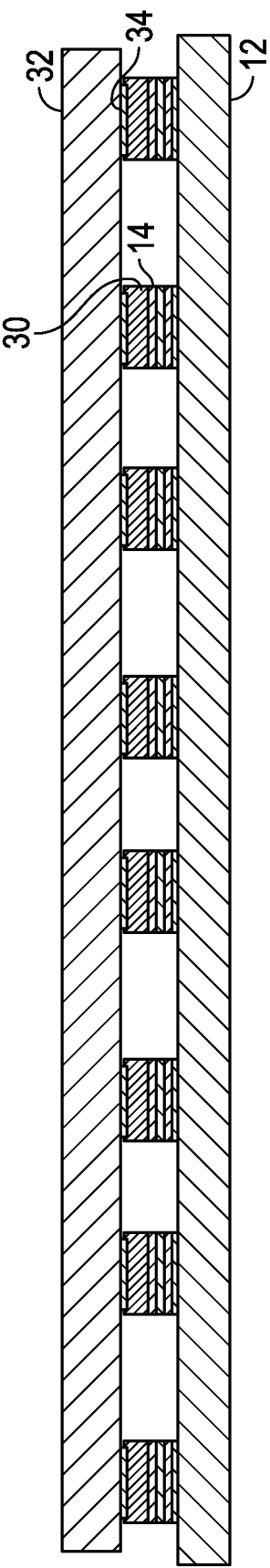
FIG. 4 is a cross sectional view of an implementation of a substrate with a wafer applied where the die pads on the wafer are aligned with the pads of the substrate.
Figure 12D:
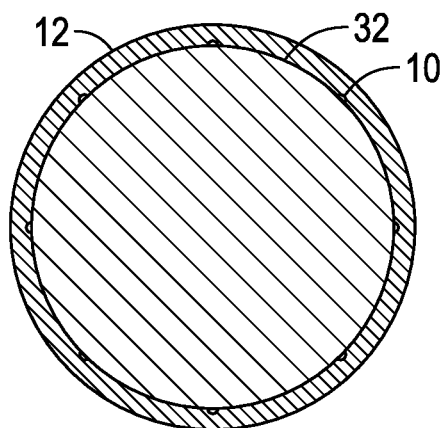
FIG. 12D is a top view of the first side of the substrate with the wafer bonded to the substrate.

Referring to FIGS. 4 and 12D, the wafer 32 is shown applied over the substrate 12. As illustrated in FIG. 12D, the wafer 32 is applied in an aligned configuration relative to the substrate 12 to ensure alignment between the pads 14 and the die pads 34 as the wafer 32 contacts the die attach material 30. Any of the alignment features and techniques disclosed herein may be utilized in various implementations to accomplish the alignment between the wafer 32 and the substrate 12. As illustrated in FIG. 12D, since the substrate 12 in this implementation is larger than the wafer 32, the alignment holes 10 can be used to ensure the wafer 32 is centered over the substrate 12. Additional alignment features (such as using the wafer notch or flat) may be used to ensure the wafer is also properly rotationally aligned over the substrate 12 as well. In various implementations, where the substrate 12 is not larger than or the same size as the wafer 32 and is composed of several portions, it may be that the substrate portions are applied to the wafer 32 rather than the wafer 32 being applied to the substrate. In other implementations, portions of the wafer 32 may be applied to the substrate 12 (i.e., quarters, halves, etc.) if the wafer has been previously singulated, or multiple wafers may be applied to a single substrate (where the substrate is much larger than an individual wafer). In some implementations, individual singulated semiconductor die may be applied to the substrate 12 using various die placement techniques and processes. In other implementations, a mixture of wafer portions and singulated die may be applied to the substrate 12, depending upon the ultimate configuration of the semiconductor package being manufactured.

Figure 5:
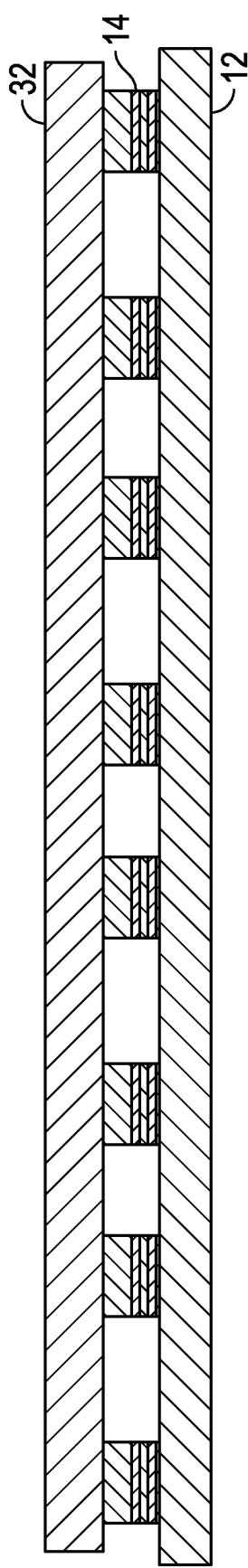
FIG. 5 is a cross sectional view of the implementation of FIG. 4 with the wafer and substrate bonded together.

Referring to FIG. 5, a cross sectional view of the wafer 32 and substrate 12 bonded together at the pads 14 following completion of the the wafer/substrate bonding process is illustrated. As illustrated, the die pads are bonded to the pads 14, and may, in particular implementations, be soldered or otherwise welded to the material of the pad stack. The wafer bonding process itself may be accomplished using various techniques. Referring to FIG. 6, the bonding process may utilize a lower plate 34 and an upper plate 36 that each take several forms and perform various functions. In a first bonding process implementation, the lower plate 34 is a work holder and the upper plate is a clamping plate which maintains a bias force between the substrate 12 and wafer 32 as the assembly of the upper plate 36, wafer 32, substrate 12, and lower plate 34 are placed in a curing chamber/oven or reflow chamber/oven to be heated. The curing chamber would be used to cure the die attach material and the reflow chamber would be used to solder or otherwise weld the metals of the die pads to the pads 14. In a second implementation, the upper plate 36 is a clamping plate and the lower plate 34 is a heater plate, and the bonding takes place as the curing or reflow occurs via the heat provided from the lower plate 34 under the bias force provided by the clamping plate. In a third implementation, the upper plate 36 and lower plate 34 are both heater plates, and the bonding process takes place under the influence of the heat provided by both plates. In a fourth implementation, the upper plate 36 is a heater plate and the lower plate 34 is a work holder. In this implementation, bonding takes place as the substrate 12 is held in the work holder and the wafer 32 is heated by the upper plate 36. The bonding that takes place in these various implementations may be a curing, reflow, or eutectic bonding process like those described herein.

Figure 13A:
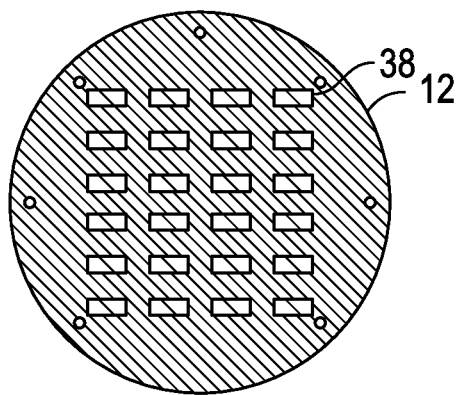
FIG. 13A is a top view of the first side of the substrate of FIG. 12D with the semiconductor die singulated.

Referring to FIGS. 7 and 13A, the substrate 12 and wafer 32 are illustrated following the completion of singulation of the semiconductor die 38 from the semiconductor wafer 32. The process of singulation of the die 38 can take place using many different processes including, by non-limiting example, saw cut, plasma etching, laser cutting, high pressure water jet, and other processes capable of cutting the materials from which the wafer 32 is made. Where saw cutting, laser cutting, and high pressure water jet processes are used, the back of the wafer will need to have alignment features placed in various locations on the wafer to permit the process tool to align the wafer prior to carrying out the cutting process. Where plasma etching processes are employed, a patterned oxide layer, photoresist mask, patterned polyimide, metal mask, hard mask or other protective pattern/structure is put in place on the back of the wafer 32 to protect the individual die 38 during the etching process. Depending upon the singulation process used, various cleaning process(es) and method(s) may need to be utilized to clean the areas between the die 38 and remove any remaining portions of the wafer 32. As illustrated in FIG. 13A, in various implementations of the method of manufacture, spaces between the die 38 are left following the singulation process. In other implementations, the space between each die 38 may be only the width of the cut itself and may be much smaller in proportion of the size of the die 38 than in the implementation illustrated in FIG. 13A.

Figure 13B:
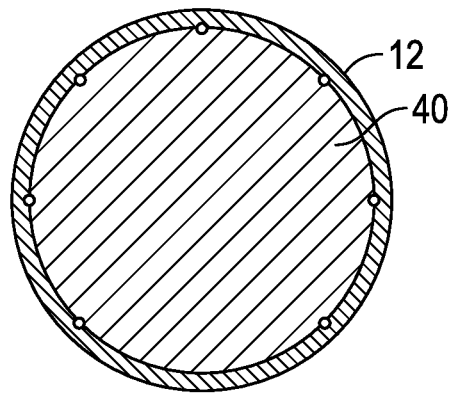
FIG. 13B is a top view of the first side of the substrate of FIG. 13A after completion of overmolding forming a plurality of semiconductor packages.

Referring to FIGS. 8 and 13B, the die 38 and substrate 12 are illustrated following the overmolding or underfill process which dispenses an overmold or underfill material over the die 38 and fills all the spaces between the pads 14 and the die 38. Where overmolding is used, the overmold material may be an epoxy resin, injection plastic material, compression molding, or other overmold (encapsulating) compound capable of flowing/filling the spaces around the die and under the pads. In various implementations, the encapsulation process completely covers the entire surface of the die 38, or may leave some portion or all of the die 38 exposed following encapsulation for later coupling with a heat transfer/dissipation device, for additional die placement, or for forming electrical or mechanical connections. In various implementations of the method, the substrate 12 and/or a mold cavity block used in the overmolding process may include structures designed to control warpage of the overmolded die. In particular implementations, a mold array package (MAP) molding process may be employed to permit a single mold cavity to be used to overmold many different die/package sizes. In other implementations, a cavity based mold process may be used for larger components to make subsequent singulation of the packages easier. A wide variety of overmolding and underfilling techniques (epoxy fillet dispensing, etc.) may be employed to complete the overmolding/underfilling process in various implementations. In some implementations, a combination of underfilling and overmolding processes may be employed where underfilling is used to fill the space under the die 38 between the pads 14 and overmolding is used to fill the space between the die 38.

Figure 9:
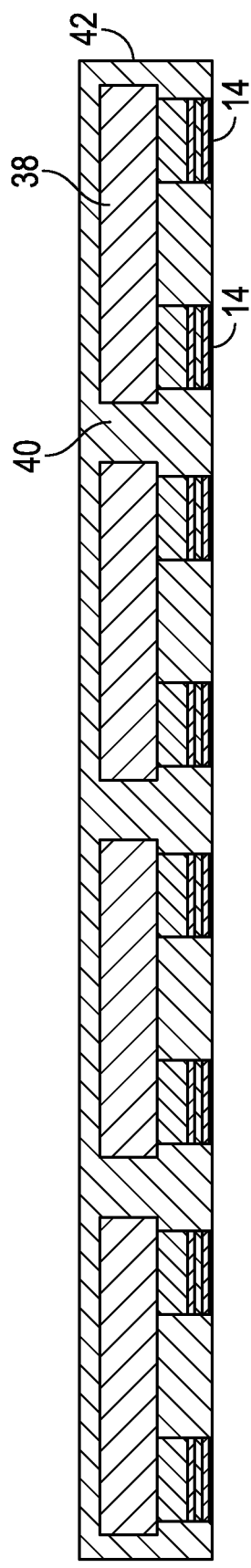
FIG. 9 is a cross sectional view of the implementation of FIG. 8 after removal of the substrate showing the exposed pads.
Figure 13C:
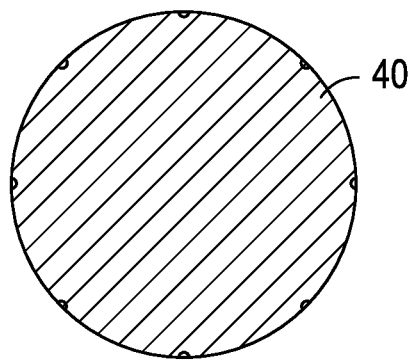
FIG. 13C is a top view of the plurality of semiconductor packages following removal of the substrate.

Referring to FIGS. 9 and 13C, the plurality of die 38 encapsulated in the encapsulating (overmolding/underfilling) material 40 (plurality of semiconductor packages 42) are illustrated after removal of the substrate 12. As illustrated, the entirety of the substrate 12 is removed in particular implementations of the method, leaving the pads 14 exposed. In other implementations, portions of the substrate 12 may be retained during the removal process for use in alignment in subsequent process steps or for mechanical or electrical interconnection. A number of processes may be utilized to remove the substrate. Where the substrate 12 is made of a metal-based material, an etch process can be used to remove the substrate 12, by etching the second side of the substrate until the entire thickness of the substrate has been removed. If the substrate is formed of a material similar to the semiconductor material(s) of the die 38, then techniques such as, by non-limiting example, ultraviolet (UV) exposure, heat, application of ultrasonic energy, and other methods of separating the pads and the encapsulating material 40 from the first side of the substrate 12 may be used. Where the substrate is a silicon-containing wafer, the substrate can be ground down completely to the pads 14, dry and/or wet etched completely away, or removed through any combination of grinding, dry, and/or wet etching. As illustrated in FIG. 9, after removal of the substrate 12, the pads 14 remain, and are exposed through the encapsulating material 40. In particular implementations, the pads 14 may be flush to the surface of the encapsulating material 40, or they may protrude outwardly or inwardly from the surrounding surface of the encapsulating material 40. In any of these implementations, because the pads are exposed directly through the encapsulating material, the resulting semiconductor package may be referred to as "leadless" or "no-lead" as the pads are contacted by leads in a socket receiving the package rather than acting as leads engaged with or soldered to a mounting structure.

In particular implementations, following the exposure of the pads 14 through the removal of the substrate 12, the method may include plating an additional layer of metal onto the exposed pads. This layer of metal may be added to ensure a pristine or improved quality metal surface is present on each pad for subsequent soldering to a circuit board or contacting in a mounting structure. This additional layer may be needed to repair or finish the surfaces of the pad that have contacted etchants or abrasives during the removal of the substrate. This layer of metal may be composed of the same material as that in the pads already or may be a similar or dissimilar metal layer. One or more layers may be added in various implementations, and the particular metals used may be any disclosed in this document used in pad structures.

Figure 10:
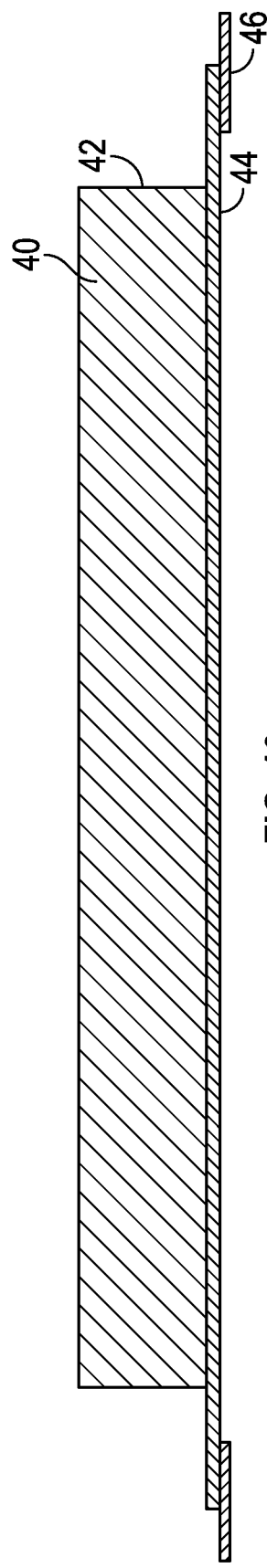
FIG. 10 is an end view of the implementation of FIG. 9 showing the overmolded semiconductor packages mounted to film and on a saw frame.
Figure 11:
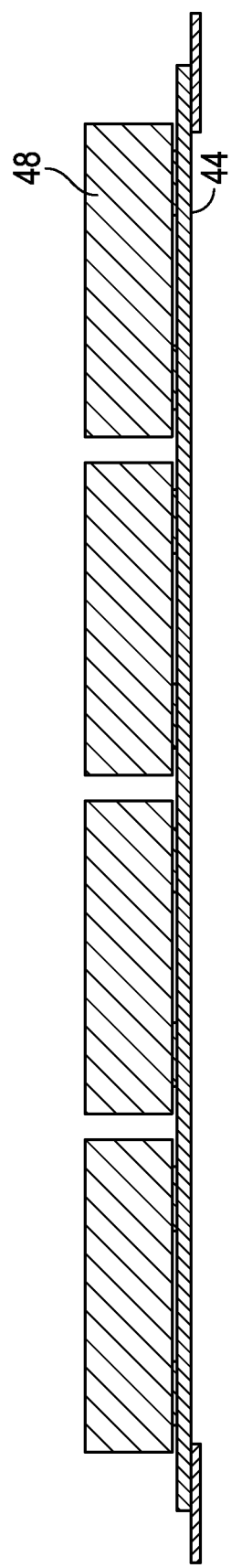
FIG. 11 is a cross sectional view of the implementation of FIG. 10 showing the semiconductor packages following singulation.
Figure 13D:
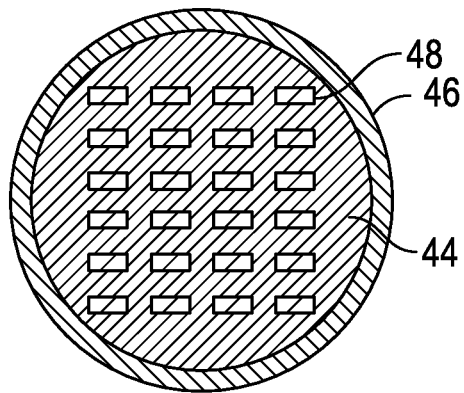
FIG. 13D is a top view of a plurality of singulated semiconductor packages following singulation after mounting to film and a saw frame.

Referring to FIG. 10, the plurality of semiconductor packages 42 (semiconductor packages 42) coupled together through the encapsulating material 40 is shown mounted on saw tape 44 and a saw frame 46 prior to singulation. In this view, the plurality of semiconductor packages 42 is shown in an end view where the end is fully encapsulated by the encapsulating material 40. The saw tape 44 that may be employed may be standard film or UV release film, depending upon the processing desired. Once mounted on saw tape 44 on a frame 46, the semiconductor packages 42 can be mounted to the saw chuck for singulation. In various implementations, laser cutting or high pressure water jet cutting could be used for singulation as well. The plurality of semiconductor packages 42 may be singulated with the pads 14 facing the saw blade or facing the saw chuck, depending on the package orientation desired by downstream process operations (i.e., the next or subsequent process step needing the package pad side up or pad side down). Various alignment structures can be utilized to enable accurate cutting of the semiconductor packages, and in various implementations, single or multiple line (street) cuts can be made to leave two or more semiconductor packages still mechanically and/or electrically coupled together through the encapsulating material 40. Referring to FIGS. 11 and 13D, the plurality of semiconductor packages 42 are illustrated after the singulation process has been completed and each package 48 is now separated from every other package while still being attached to the saw tape 44. At this point, the individual semiconductor packages 42 can be removed from the saw tape 44 and sent on for further processing as individual units in carrier tape or in another package handling/storage device.

Figure 14:
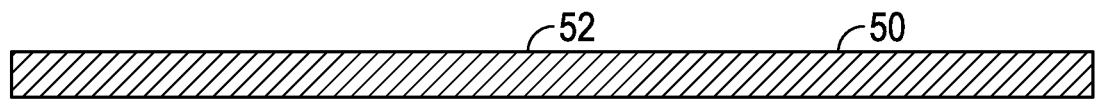
FIG. 14 is a cross sectional view of another implementation of a substrate.
Figure 15:
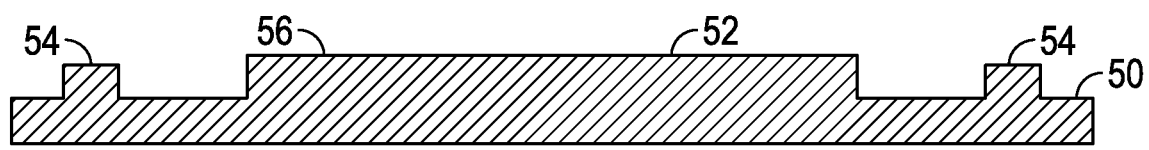
FIG. 15 is a cross sectional view of the substrate implementation of FIG. 14 after patterning.
Figure 16:
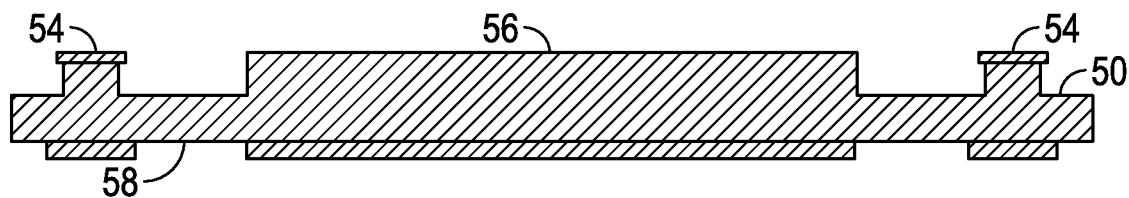
FIG. 16 is a cross sectional view of the substrate implementation of FIG. 15 after selective plating.

Referring to FIG. 14, implementations of a second method of manufacturing a semiconductor package utilize a substrate 50, which is then patterned to correspond with a plurality of semiconductor die included in a wafer. As illustrated in FIG. 15, the pattern may include the formation of features of varying dimensions, shapes, and heights relative to the original surface of the first side 52 of the substrate 50. As illustrated, the pad features 54 have been created, and are etched slightly lower than the central portion 56 of the substrate 50. The patterning process may be any disclosed in this document, including etching, selective etching, and mechanical stamping. The substrate 50 used in various implementations may also be made of any substrate material disclosed herein. FIG. 16 shows the substrate 50 after portions of it have been selectively plated with a metal. In the implementation illustrated, the pads 54 have been plated on both the first side 52 and second side 58 of the substrate 50 while the central portion of the substrate 56 was plated on only the second side 58 of the substrate 50. Other combinations of plating of the features are possible using the selective plating process, which may be any plating or metal application process disclosed herein.

Figure 17:
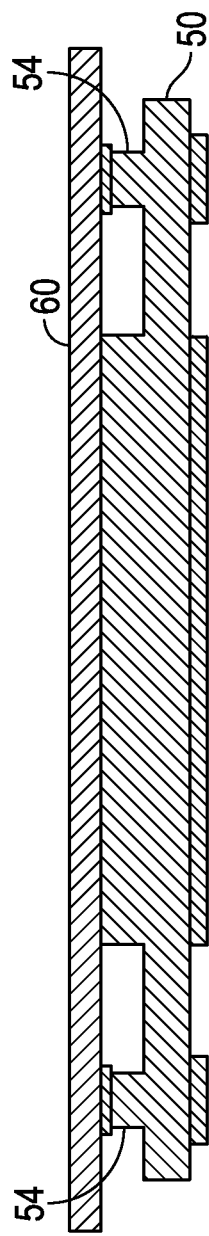
FIG. 17 is a cross sectional view of the substrate implementation of FIG. 16 after wafer bonding.
Figure 18:
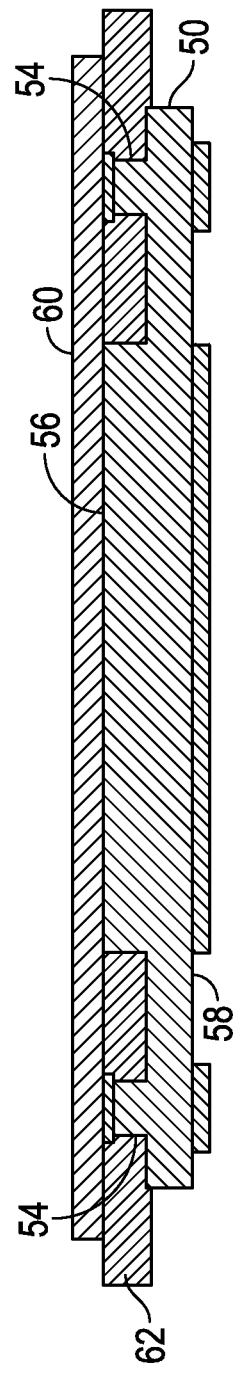
FIG. 18 is a cross sectional view of the substrate implementation of FIG. 17 after completion of overmolding/underfilling.

Referring to FIG. 17, a wafer 60 is now bonded to the substrate 50. The bonding process may be any disclosed in this document or any combination of processes disclosed in this document. Because the plating of the features that may be in contact with the surface of the wafer may be selective, the bonding may take place through reflowing in certain areas of the wafer where the metals from the die pad contact the metal of the pad 54 and through curing in areas of the wafer where the silicon or other passivating material(s) covering the wafer contact the unplated portions of the substrate 50 and are bonded through a material such as an epoxy. Multiple bonding methods and steps may accordingly be employed to complete the bonding process. Following bonding, an overmold/underfill process is employed to fill the spaces between the pads 54 and the central portion 56 and the wafer 60 as illustrated in FIG. 18. The overmold/underfill material 60 (encapsulating material) may be any disclosed in this document and may be applied using any method disclosed herein. In many implementations, the use of a combined overmold and underfill process may be employed to fill the desired areas.

Figure 19:
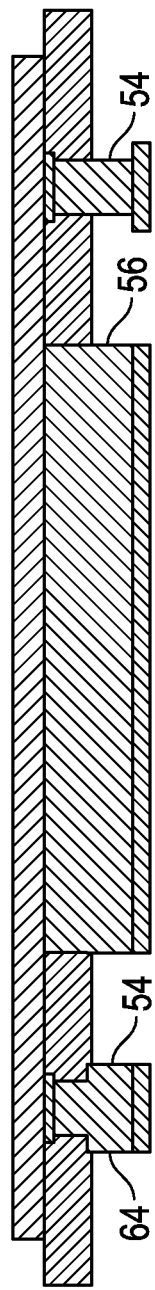
FIG. 19 is a cross sectional view of the substrate implementation of FIG. 18 following selective removal of the thickness of the substrate from a second side of the substrate.
Figure 20:
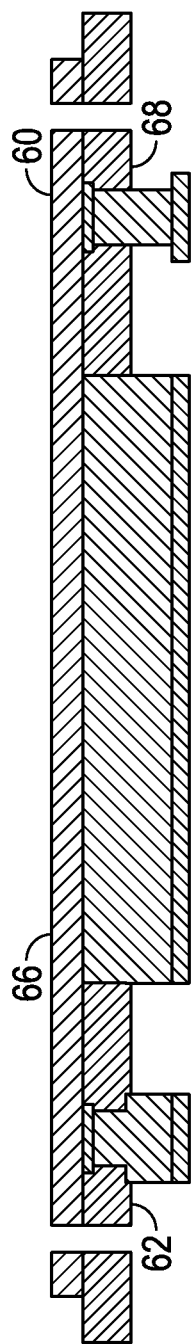
FIG. 20 is a cross sectional view of a singulated semiconductor package following singulation.

FIG. 19 illustrates the substrate 50 after it has been etched back from the second side 58 of the substrate 50 through the remaining thickness 64 of the substrate 50, separating the pads 54 from the central portion 56. In situations where the substrate 50 is electrically conductive, this step serves to electrically isolate the pads 54 from the central portion 56 where the encapsulating material 62 is an electrical insulator. The selective etch may take place using the selectively plated material on the second side 58 of the substrate 50 as a mask, or additional masking material may be employed (which may be any disclosed in this document). As illustrated, the directionality of the etch may be substantially anisotropic (as illustrated by the left-most pad 54) or isotropic, as illustrated by the right-most pad (54) which shows undercutting under the plated material. Etches of varying directionality may be employed in all etching processes disclosed herein. While etching may be used to remove the material, singulation from the second side 58 of the substrate 50 could also be employed to remove the material in particular implementations.

Following etching and/or singulation, the semiconductor die 66 are then singulated to mechanically separate each semiconductor package 68 from the rest of the plurality of semiconductor packages joined through the wafer 60 and the encapsulating material 62. Any of the singulation processes disclosed in this document may be employed in various implementations to singulate the packages 68. In particular implementations, the singulation process may be selective, meaning that two or more of the packages 68 may continue to be coupled together mechanically and/or electrically.

Figure 21:
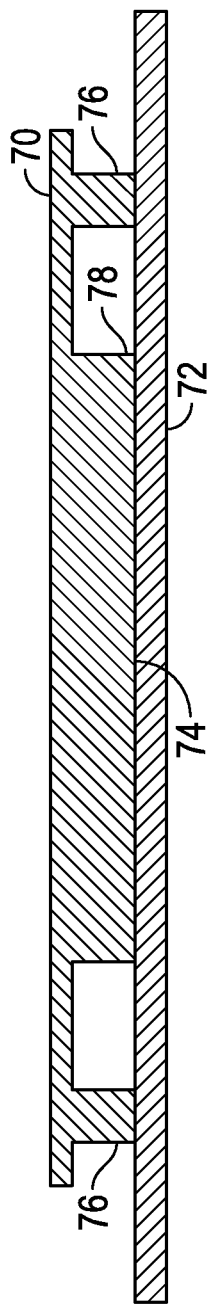
FIG. 21 is a cross sectional view of another substrate implementation having a pattern on a first side bonded to a wafer having a plurality of semiconductor die.
Figure 22:
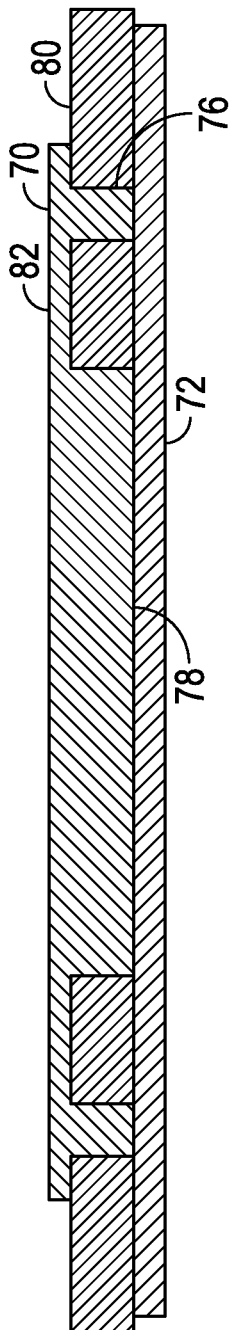
FIG. 22 is a cross sectional view of the substrate implementation of FIG. 21 following completion of overmolding/underfilling.
Figure 23:
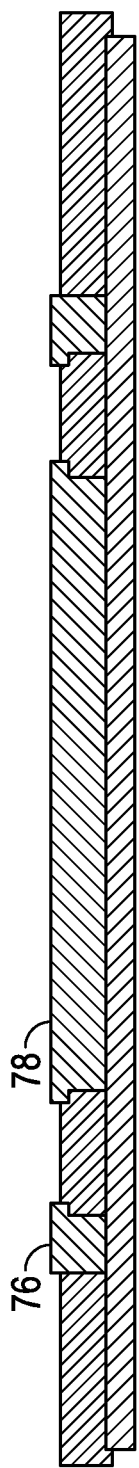
FIG. 23 is a cross sectional view of the implementation of FIG. 22 following selective removal of the thickness of the substrate from the second side of the substrate.
Figure 24:
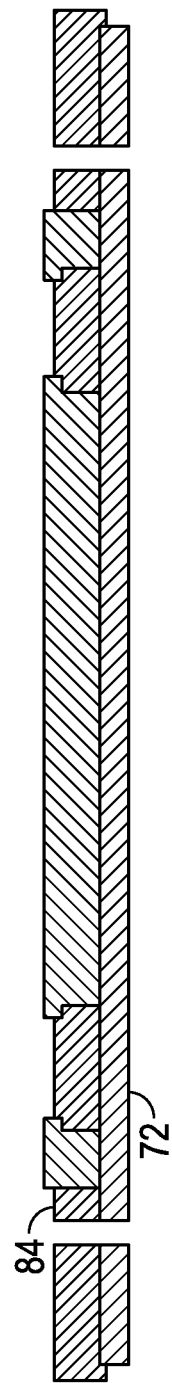
FIG. 24 is a cross sectional view of a semiconductor package following singulation of the package.

Implementations of a third method of manufacturing a semiconductor package utilize a patterned substrate 70. As illustrated in FIG. 21, the patterned substrate 70 is then attached/bonded to a wafer 72 on a first side 74 of the substrate 70 but where the substrate is oriented above the wafer 72 rather than beneath as in previous method implementations. The patterning on the substrate 70 may be formed using any method or process disclosed in this document, and a wide variety of features include pads 76 and central portions 78 may be included in the pattern. The attachment/bonding process utilized between the wafer 72 and the substrate 70 may also be any disclosed herein, and may involve a die attach material in particular implementations. Following bonding, referring to FIG. 22, an overmolding/underfilling process is used to fill the space(s) between the wafer 72 and the substrate 70 with overmold/underfill material 80 (encapsulating material), which may be any material type and applied using any process disclosed in this document. In particular implementations, film molding may be employed to do the overmold/underfill. Referring to FIGS. 22, 23 and 24, following encapsulation, an etching/singulation process may be used to separate the tie bars 82 that join the pads 76 to the central portion 78. As previously discussed, where the substrate is electrically conductive, this may serve to electrically isolate the pads 76 from the central portion 78. The wafer 72 is then singulated, separating the individual semiconductor packages 84 from each other. The wafer singulation process may be any disclosed in this document.

Figure 25B:
FIG. 25B is a cross sectional view of a semiconductor package formed by stacking two packages with the surfaces of the semiconductor die being placed in contact with each other.
Figure 25A:
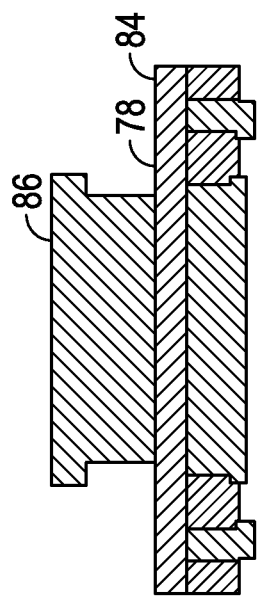
FIG. 25A is a cross sectional view of a semiconductor package with a heat dissipation device coupled to the package and in contact with the surface of the semiconductor die.

As previously discussed, the singulation process for the wafer may be selective, meaning that two or more of the packages 84 may be either mechanically and/or electrically coupled together following singulation. Referring to FIG. 25A, implementations of packages 42, 68, 84 creating using the method implementations disclosed herein may have heat dissipation devices 86 (such as heat sinks, heat pipes, etc.) coupled to the surface of the semiconductor die 78 following singulation or prior to singulation. In other implementations, the heat dissipation devices 86 may be coupled to the central portion 78 of the packages, depending upon the mounting configuration used. In other implementations, two or more packages 84 may be stacked and the surfaces of the semiconductor die in each package placed in contact with each other. In other implementations, the stacking may place the substrate in one package against the surface of the semiconductor die. A wide variety of arrangements of packages are possible using the principles disclosed herein.

Figure 26A:
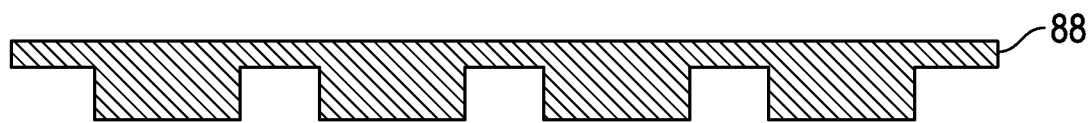
FIG. 26A is a cross sectional view of an implementation of a first base frame.
Figure 26B:
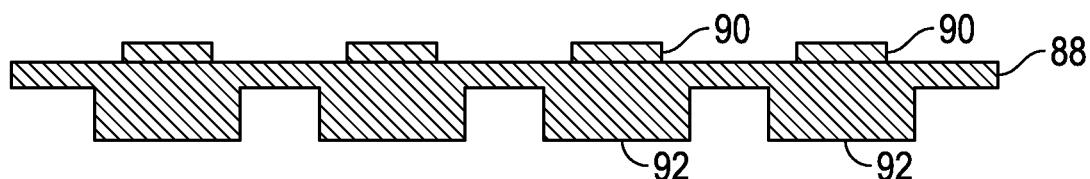
FIG. 26B is a cross sectional view of the first base frame following application of die attach material.
Figure 26C:
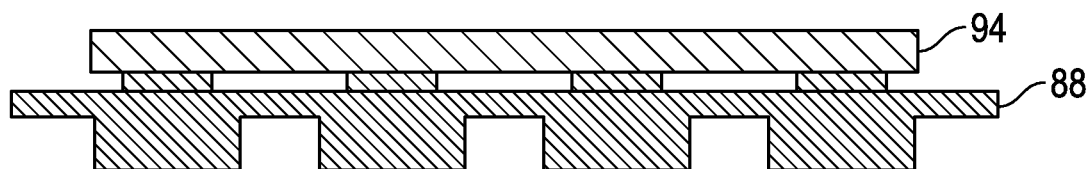
FIG. 26C is a cross sectional view of the first base frame following bonding of a wafer containing a plurality of semiconductor die to the first base frame.
Figure 26D:
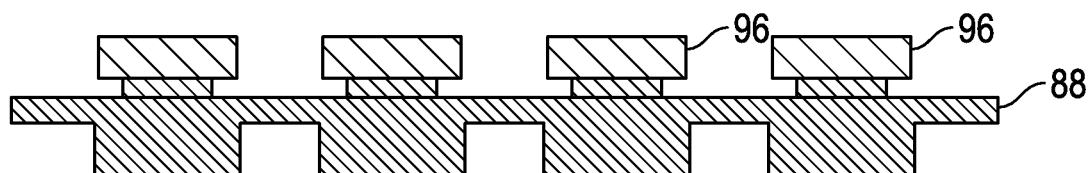
FIG. 26D is a cross sectional view of the first base frame following singulation of the plurality of semiconductor die.
Figure 26E:
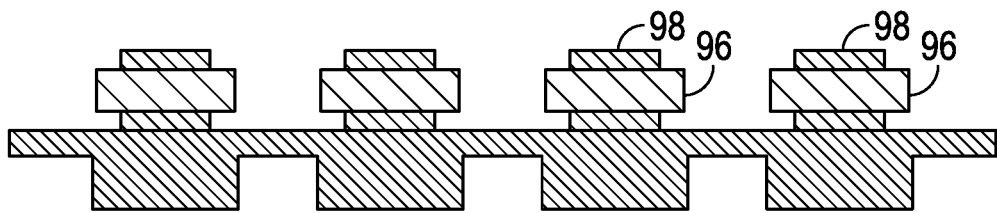
FIG. 26E is a cross sectional view of the first base frame following application of die attach material to the plurality of semiconductor die.
Figure 26F:
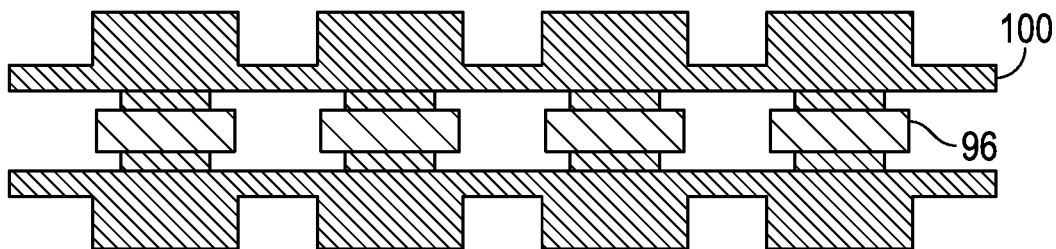
FIG. 26F is a cross sectional view of the first base frame following bonding of a second base frame to the plurality of semiconductor die.
Figure 26G:
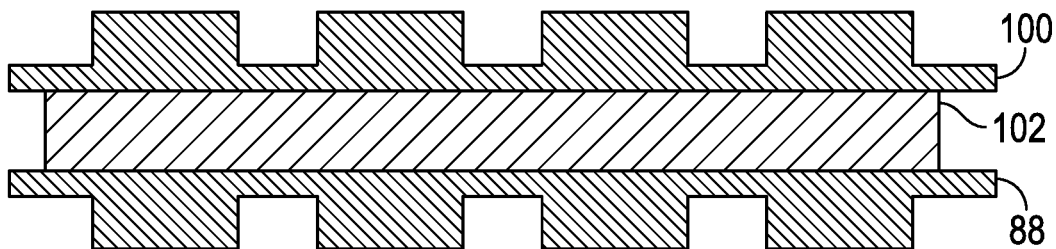
FIG. 26G is a cross sectional view of the first and second base frames following overmolding/underfilling of the semiconductor die.
Figure 26H:
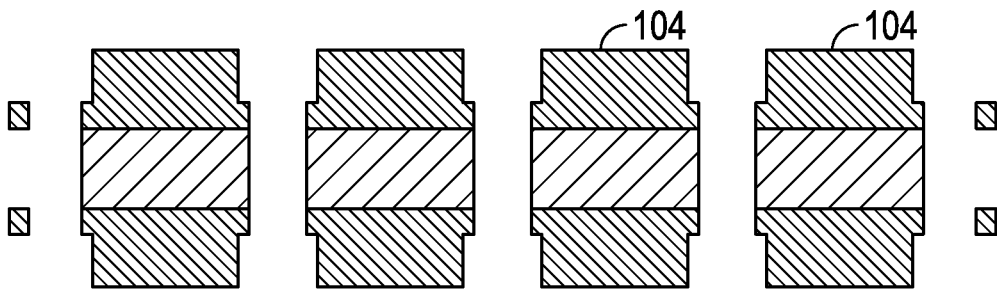
FIG. 26H is a cross sectional view of a plurality of semiconductor packages following singulation.

Implementations of a fourth method of manufacturing a semiconductor package include providing a base frame 88 (first base frame) for terminals for use in a press fit package type (see FIG. 26A). The base frame 88 contains a plurality of terminals for use in the press fit package. Referring to FIG. 26B, die attach material 90 is then applied to the base frame 88 above each of the terminals 92. The die attach material 90 employed and method of application may be any disclosed in this document. Following application of the die attach material 90, a wafer 94 with a plurality of semiconductor die is then attached/bonded to the first base frame 88 using any of the attachment/bonding processes disclosed herein (see FIG. 26C). The wafer 92 is then singulated to separate the die 96 in the wafer 92 bonded to the first base frame 88 (FIG. 26D). In particular implementations, referring to FIG. 26E, additional die attach material 98 is then applied to each of the die 96. In other implementations, the die attach material 98 may be applied to a second base frame rather than to the die 96. Following application of the die attach material 98, as illustrated in FIG. 26F, the second base frame 100 is attached/bonded to the die 96 using any process disclosed herein. At this point, an overmold/underfill process is employed to encapsulate each of the die between the first base frame 88 and the second base frame 100 with encapsulation material 102 (see FIG. 26G). Any of the overmold/underfill processes and materials disclosed herein may be employed in this step of the method. Each of the plurality of semiconductor packages 104 defined by the first base frame 88 and the second base frame 100 are then singulated (see FIG. 26H), which creates a set of individual semiconductor packages 104 which are now press fit packages.

Figure 27:
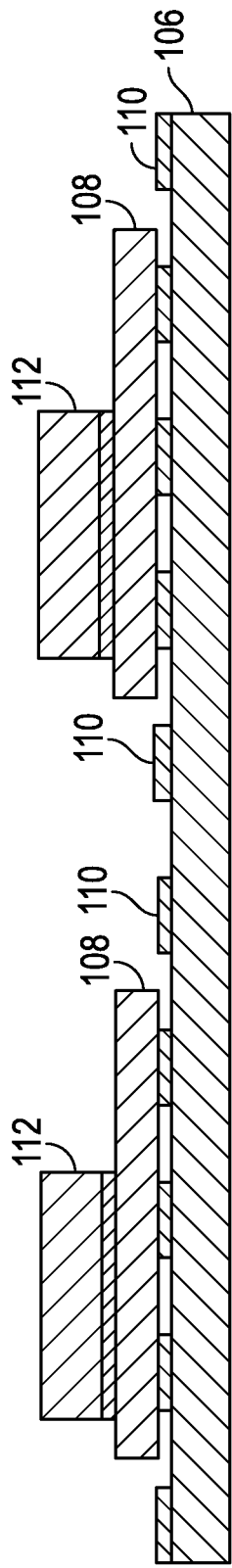
FIG. 27 is a cross sectional view of another substrate implementation after attaching a second die to a first die.

Implementations of a fifth method of forming a semiconductor package are similar to the first implementation other than that following singulation of the individual die from the wafer, particular implementations may leave pads on the substrate exposed. In other implementations of the method, however, all of the pads on the substrate may be in contact with the die pads. Referring to FIG. 27, an implementation of a substrate 106 is illustrated bonded to die 108 (first die) with pads 110 exposed. In such implementations, prior to bonding, the die attach material may be selectively applied to those pads which will be in contact with die pads and not to those pads which will be exposed following singulation. As illustrated in FIG. 27, a second die 112 has been attached to the first die 108. The attachment process of stacking the second die 112 on the first die 108 may take place through a variety of conventional methods and also through any of the attaching/bonding method disclosed herein, including using die attach material.

Figure 28:
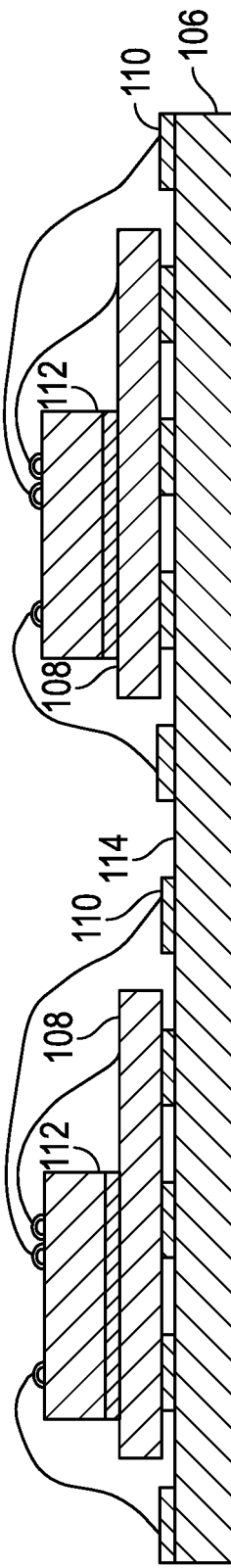
FIG. 28 is a cross sectional view of another substrate implementation after wire bonding of the second die to the first die and to the substrate.
Figure 29:
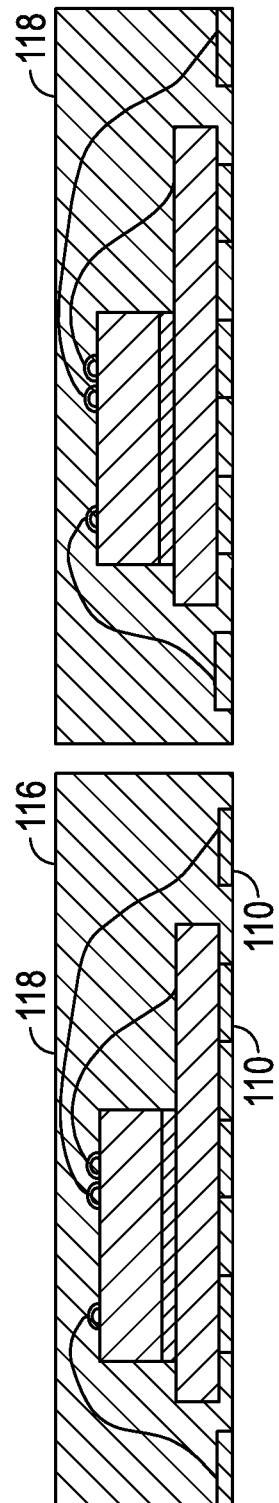
FIG. 29 is a cross sectional view of semiconductor packages following overmolding and singulation.

Following attaching of the second die 112 to the first die 108, the second die 112 is then electrically connected to the substrate 106. This may be accomplished in several ways. In some implementations, the die pads on the second die 112 are wire bonded to the first die 108. In other implementations, the die pads on the second die 112 are wire bonded to the pads 110 of the substrate 106. In particular implementations, as illustrated in FIG. 28, the second die 112 is wire bonded to the first die 108 and the pads 110. Following wire bonding, the wafer and first side 114 of the substrate 106 are then encapsulated using an overmolding/underfilling process like those disclosed herein and encapsulating material 116 disclosed in this document. Following encapsulation, the substrate 106 is removed, exposing the pads 110 as previously described herein. The plurality of semiconductor packages 118 are then singulated (see FIG. 29), creating a stacked die no-lead semiconductor package. The singulation and substrate removal processes may be any disclosed herein.

Referring to FIG. 30, implementations of methods of manufacturing semiconductor packages disclosed herein may be utilized to manufacture semiconductor packages for die 120 that have die pads that include bumps 122 through bonding of the bumps 122 to the pads 124 of the substrate. In such implementations, reflow bonding processes and underfill molding methods may be utilized to ensure that the bumps 122 properly attach to the pads 124 and that the underfill (encapsulating) material 126 fills all of the areas between the bumps 122. FIG. 30 illustrates two packages 128 following the final singulation step that each include die with bumps 122. In various implementations, the methods disclosed herein may be used to package die on a semiconductor wafer that are both bumped and unbumped through adjustments in the bonding process and formation of the pads on the substrate. A wide variety of possible packages involving bumped and unbumped die may be constructed using the principles disclosed herein.

Referring to FIG. 31, implementations of methods of manufacturing semiconductor packages disclosed herein may be utilized to manufacture semiconductor packages without using a substrate material, directly from a wafer 130 comprising a plurality of active devices (die) 132. Each of the die 132 includes one or more die pads 134, forming, in combination with all of the die pads 134 of the various die 132, a plurality of die pads 134. Referring to FIG. 32, in implementations of the method, a plurality of package pads 136 are formed and coupled to the plurality of die pads 134, one package pad to each die pad. In particular implementations, the package pads 136 are plated onto the plurality of die pads 134, though in various implementations, other methods of coupling a metal material to each of the die pads could be used. In particular implementations, the package pads 136 may be plated about 5 to about 10 microns above the surface of the die pads 134. The package pads 136 may be made of any pad type made of any material type disclosed in this document, and may, in some implementations, be bumps.

Figure 33:
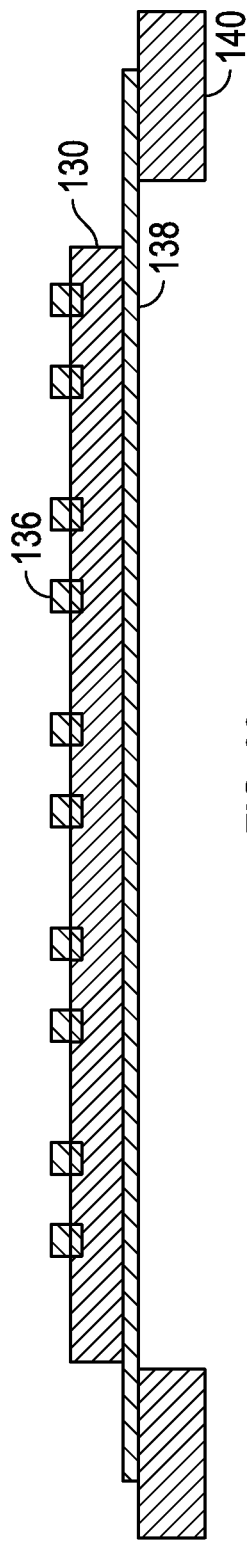
FIG. 33 is a cross sectional view of the wafer of FIG. 32 coupled to wafer singulation tape and a frame.
Figure 34:
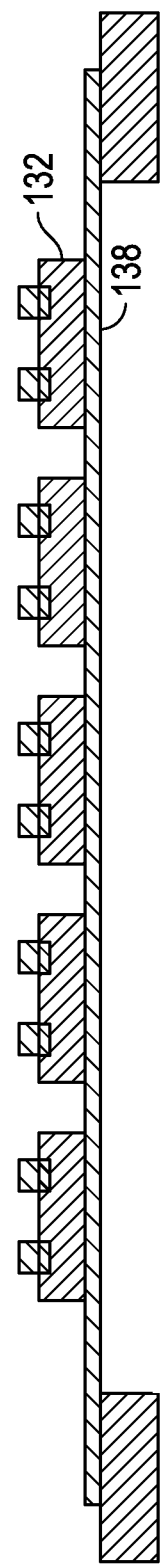
FIG. 34 is a cross sectional view of the plurality of die after singulation.
Figure 35:
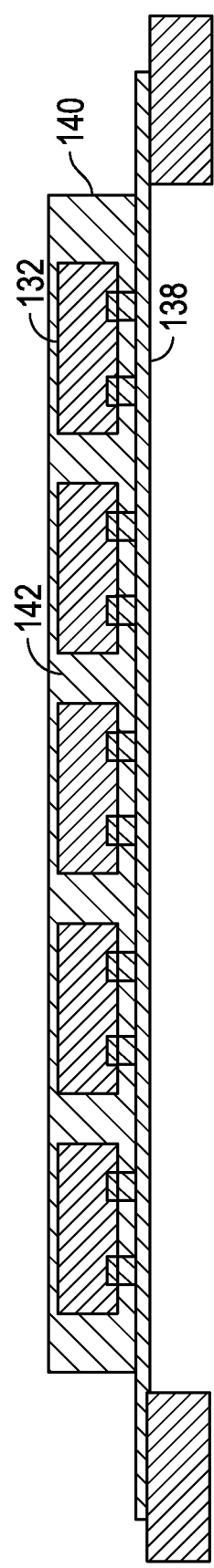
FIG. 35 is a cross sectional view of the plurality of die after overmolding/encapsulation/underfilling forming a plurality of semiconductor packages.

Referring to FIG. 33, after the package pads 136 have been formed, the wafer 130 is mounted to wafer singulation tape 138 on a frame 140. In some implementations, like the one illustrated in FIG. 33, the wafer 130 is mounted package pad side up; in others, like the one illustrated in FIG. 35, the wafer 130 is mounted package pad side down. In implementations where the wafer 130 is mounted package pad side down, oxide and backside alignment features may be used to permit the wafer to be aligned during processing the various processing steps following mounting. In various implementations, the wafer singulation tape 138 is dual flat no-lead (DFN) mold tape. In other implementations, the wafer singulation tape 138 is tape grid ball array (TBGA) flex tape. Where the tape is TBGA flex tape, the wafer singulation tape 138 may include in particular implementations a plurality of package pad vias through the width of the tape which permit the package pads 136 to extend into and/or through them.

Following mounting of the wafer 130 to the wafer singulation tape 138, die 132 are singulated. In particular implementations, the singulation may take place through use of a plasma etching process. Where plasma etching is used, the wafer 130 may be patterned to aid in the selective etching process. The patterning material may be an oxide pattern on the back side of the wafer, a photoresist, hardmask, or other material that resists the etching process. In particular implementations, the plasma etching process that may be employed may be deep reactive ion etching (DRIE). In other implementations, other singulation techniques may be employed to separate the die 132 from each other, including any of those disclosed in this document.

With the plurality of die 132 separated from each other, the method includes overmolding, encapsulating, and/or underfilling the die 132 with an overmold/encapsulating/underfill material 140, respectively. Any of the overmolding, encapsulating, and underfilling methods, systems, and materials disclosed in this document may be employed in various implementations. Also, combinations of overmolding, encapsulating, and underfilling methods may be employed in particular implementations. Once enclosed in the overmold/encapsulating/underfill material 140, the plurality of die 132 now form a plurality of semiconductor packages.

Figure 36:
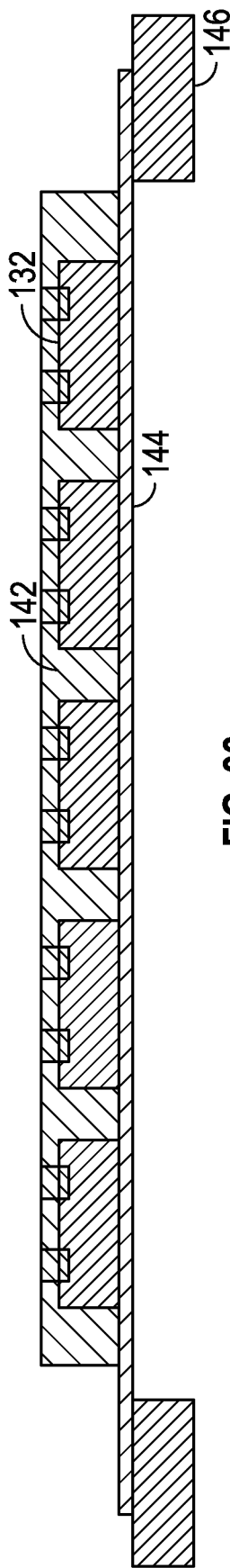
FIG. 36 is a cross sectional view of the plurality of semiconductor packages of FIG. 35 mounted to package singulation tape and a frame.
Figure 37:
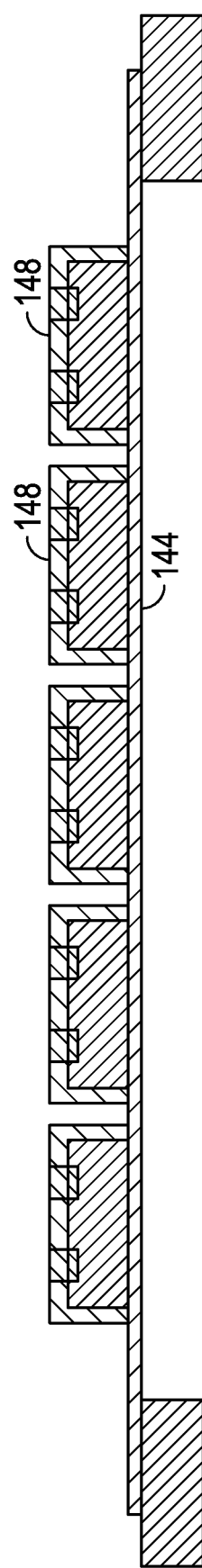
FIG. 37 is a cross sectional view of the plurality of semiconductor packages after singulation.
Figure 38:
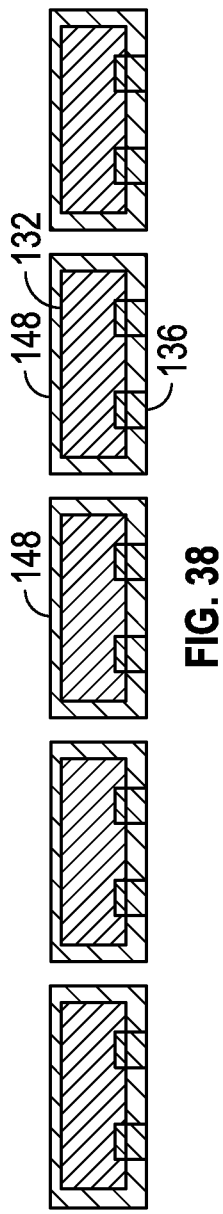
FIG. 38 is a cross sectional view of the plurality of semiconductor packages after demounting from the package singulation tape, showing the flat lead-less nature of the packages.

In implementations of the method where the wafer singulation tape 138 is DFN mold tape, the plurality of semiconductor packages 142 are demounted from the DFN mold tape and remounted to package singulation tape 144 coupled to a frame 146 (see FIG. 36). The package singulation tape 144 may be any singulation tape disclosed in this document. In implementations of the method where the wafer singulation tape 138 is TBGA flex tape, the plurality of semiconductor packages 142 and the wafer singulation tape 138 remain coupled (through the package pad vias in some implementations) and both are mounted to the wafer singulation tape 138. Following mounting to the package singulation tape 144, and referring to FIG. 37, the plurality of packages 142 are then singulated to separate them from each other as desired to form a plurality of separated semiconductor packages 148. Any of the package singulation methods and systems disclosed in this document may be employed in various implementations. As seen in FIG. 38, the separated semiconductor packages 148 are then removed from the wafer singulation tape 138 and the die 132 can now be coupled to a circuit board or other mounting device through the package pads 136 in a flat, lead-less configuration.

In places where the description above refers to particular implementations of methods of manufacturing semiconductor packages, semiconductor packages, die, substrates, and implementing components, sub-components, methods and sub-methods, it should be readily apparent that a number of modifications may be made without departing from the spirit thereof and that these implementations, implementing components, sub-components, methods and sub-methods may be applied to other implementations of methods of manufacturing semiconductor packages, and other implementations of semiconductor packages, die, substrates, and other implementing components.

What is claimed is:

1. A method of manufacturing a semiconductor package, the method comprising:
    providing a substrate, the substrate having a first side, a second side, and a thickness where the first side of the substrate comprises a pattern;
    bonding a wafer comprising a plurality of semiconductor die to the first side of the substrate at one or more die pads comprised in each one of the plurality of semiconductor die;
    one of overmolding or underfilling the first side of the substrate with one of an overmold material or an underfill material, respectively;
    from the second side of the substrate, selectively removing one or more portions of the thickness of the substrate; and
    singulating the plurality of semiconductor die and one of the overmold material or the underfill material to form a plurality of semiconductor packages.

2. The method of claim 1, wherein providing the substrate further comprises wherein the pattern comprised in the first side of the substrate is formed by a process selected from the group consisting of selectively etching the pattern into the first side of the substrate, stamping the pattern into the first side of the substrate, selectively plating the pattern onto the first side of the substrate, and any combination thereof.

3. The method of claim 1, further comprising stacking two or more of the plurality of semiconductor packages and one of electrically coupling and mechanically coupling the two or more stacked semiconductor packages thereby.

4. The method of claim 1, further comprising coupling a heat dissipation device to each of the plurality of semiconductor packages, the heat dissipation device being placed in contact with the plurality of semiconductor die.

5. The method of claim 1, wherein singulating the plurality of semiconductor die and one of the overmold material or the underfill material to form the plurality of semiconductor packages further comprises selectively singulating leaving two or more of the plurality of semiconductor packages coupled together where the coupling of the two or more semiconductor packages is one of electrical or mechanical.

6. The method of claim 1, wherein each semiconductor die of the plurality of semiconductor die is coupled over two die pads.

7. The method of claim 1, wherein a metal layer separates the one or more die pads and the wafer.

8. A method of manufacturing a semiconductor package, the method comprising:
- patterning a first side of a substrate;
- coupling a wafer comprising a plurality of semiconductor die to the first side of the substrate;
- applying a mold compound to the first side of the substrate;
- exposing the mold compound by selectively removing one or more portions of the second side of the substrate; and
- singulating the plurality of semiconductor die and mold compound to form a plurality of semiconductor packages.

9. The method of claim 8, wherein patterning the substrate comprises forming a plurality of cavities in the first side of the substrate between a central portion of the substrate and two die pads of the substrate.

10. The method of claim 8, further comprising coupling a first metal plate to the first side of the substrate and coupling a second metal plate to the second side of the substrate.

11. The method of claim 8, wherein the wafer is directly coupled to a central portion of the substrate and a metal plate is coupled between a die pad of the substrate and the wafer.

12. The method of claim 8, wherein selectively removing one or more portions of the second side of the substrate comprises etching the second side of the substrate.

13. The method of claim 8, wherein each semiconductor die of the plurality of semiconductor die covers a central portion of the substrate and two die pads of the substrate.

14. The method of claim 8, wherein a thickness of a die pad formed in the substrate is less than a thickness of a central portion of the substrate.

15. A method of manufacturing a semiconductor package, the method comprising:
- forming one or more recesses in a first side of a substrate, wherein the one or more recesses separate one or more die pads of the substrate from a central portion of the substrate;
- coupling a wafer comprising a plurality of semiconductor die to the first side of the substrate;
- removing one or more portions of the substrate between the central portion of the substrate and the one or more die pads of the substrate; and
- singulating the plurality of semiconductor die.

16. The method of claim 15, further comprising coupling a first metal plate to a first side of the substrate and coupling a second metal plate to a second side of the substrate.

17. The method of claim 15, wherein the wafer is directly coupled to the central portion of the substrate and a metal plate is coupled between the one or more die pads of the substrate and the wafer.

18. The method of claim 15, wherein removing one or more portions of the substrate comprises etching the substrate from the second side of the substrate.

19. The method of claim 15, further comprising applying a mold compound within the one or more recesses.

20. The method of claim 19, wherein the mold compound comprises an epoxy resin.

* * * * *